(12) United States Patent
Kolake et al.

(10) Patent No.: US 8,125,131 B2
(45) Date of Patent: Feb. 28, 2012

(54) NANO FILAMENT STRUCTURE AND METHODS OF FORMING THE SAME

(75) Inventors: Subramanya Mayya Kolake, Gyeonggi-do (KR); In-Seok Yeo, Seoul (KR); Xiao Feng Wang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 12/487,238

(22) Filed: Jun. 18, 2009

(65) Prior Publication Data
US 2009/0322200 A1 Dec. 31, 2009

(30) Foreign Application Priority Data
Jun. 27, 2008 (KR) .................. 10-2008-0061773

(51) Int. Cl.
*H01J 9/02* (2006.01)
(52) U.S. Cl. ........................ 313/310; 313/497
(58) Field of Classification Search .................. 313/414, 313/441–460, 495–497, 293–304, 306, 309–310, 313/346, 351, 355; 365/145–151, 129, 103, 365/166; 257/1–5, 211, 213, 414, 208; 174/261–266; 361/792–795
See application file for complete search history.

(56) References Cited

U.S. PATENT DOCUMENTS

| | | | |
|---|---|---|---|
| 6,545,396 B1 * | 4/2003 | Ohki et al. ............... | 313/309 |
| 6,643,165 B2 * | 11/2003 | Segal et al. .............. | 365/151 |
| 6,984,535 B2 | 1/2006 | Son et al. | |
| 7,446,044 B2 * | 11/2008 | Kaul et al. ............... | 438/684 |
| 2005/0174028 A1 * | 8/2005 | Jung et al. ............... | 313/309 |
| 2006/0084570 A1 | 4/2006 | Kopley et al. | |
| 2006/0246813 A1 * | 11/2006 | Lee et al. ............... | 445/59 |
| 2006/0278902 A1 * | 12/2006 | Sun et al. ............... | 257/288 |
| 2007/0110971 A1 | 5/2007 | Bonnot | |

FOREIGN PATENT DOCUMENTS

| | | |
|---|---|---|
| JP | 2006-511914 A | 4/2006 |
| JP | 2006-524625 | 11/2006 |
| JP | 2007-534508 | 11/2007 |
| KR | 102005-0088394 A | 9/2005 |
| WO | WO 2004/059713 A1 | 7/2004 |
| WO | WO 2004/094690 A1 | 11/2004 |
| WO | WO 2005/102922 A1 | 11/2005 |
| WO | WO 2007/018554 A2 | 2/2007 |

OTHER PUBLICATIONS

Chen et al., "A self-assembled synthesis of carbon nanotubes for interconnects," Institute of Physics Publishing, Nanotechnology 17 (2006) pp. 1062-1066.
Chen et al., "Synthesis and emission properties of carbon nanotubes grown by sandwich catalyst stacks," J. Vac. Sci. Technol. B 24(2), Mar./Apr. 2006, pp. 1017-1020.

* cited by examiner

*Primary Examiner* — Nimeshkumar Patel
*Assistant Examiner* — Donald Raleigh
(74) *Attorney, Agent, or Firm* — Myers Bigel Sibley & Sajovec, P.A.

(57) ABSTRACT

Provided are a nano filament structure and a method of forming the nano filament structure. The nano filament structure includes a first layer disposed on a substrate, a second layer having a gap of nanometer size disposed on the first layer, a catalyst layer interposed between the first layer and the second layer, and a nano filament. One end of the nano filament is in contact with the catalyst layer and grows by penetrating the gap of the second layer.

6 Claims, 6 Drawing Sheets

NANO FILAMENT STRUCTURE AND METHODS OF FORMING THE SAME

CROSS-REFERENCE TO RELATED APPLICATIONS

This U.S. non-provisional patent application claims priority under 35 U.S.C. §119 of Korean Patent Application No. 2008-61773, filed on Jun. 27, 2008, the entire contents of which are hereby incorporated by reference.

BACKGROUND

Exemplary embodiments disclosed herein relate to a nano filament, and more particularly, to a carbon nano tube.

A carbon nano tube has a large anisotropic structure. A carbon nano tube has various structures such as a single wall, a multi wall bundle. An unusual structure and a physical property of a carbon nano tube may be applied to a plane display device, a memory device, a second battery, nano chemical sensor, an electromagnetic wave shielding material and a compound material for a removal of an electrostatic.

SUMMARY

Exemplary embodiments provide a nano filament structure. The nano filament structure may include a first layer disposed on a substrate; a second layer having a gap of nanometer size disposed on the first layer; a catalyst layer interposed between the first layer and the second layer; and a nano filament. One end of the nano filament is in contact with the catalyst layer and penetrates the gap of the second layer.

Exemplary embodiments provide a method of forming a nano filament structure. The method may include forming a first layer on a substrate; forming a second layer having a gap of nanometer size on the first layer; forming a catalyst layer interposed between the first layer and the second layer; and forming a nano filament which grows from the catalyst layer to penetrate the gap of the second layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1:
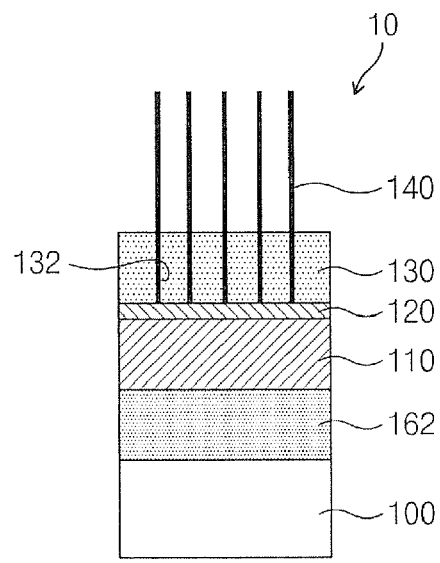
FIG. 1 is a cross sectional view of a nano filament structure according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

A nano filament must be firmly fixed to a supporting portion. According to a method of forming a conventional nano filament, the nano filament has a straight characteristic and grows on a catalyst layer. Accordingly, it is difficult that the nano filament is firmly fixed to a catalyst layer. A contact resistance between the nano filament and a supporting portion must be small in order to apply a voltage to the nano filament. A density and a diameter of a nona filament are mainly controlled depending on a characteristic of the catalyst layer. Thus, it is difficult to control a density and a diameter of a nano filament. A nano filament structure according to an embodiment of the present invention may be applied to an electric field emission device, tips of scanning probe microscope, an electro mechanical actuator, a nano tweezer, a memory, a switch and an electric material.

FIG. 1 is a cross sectional view of a nano filament structure according to an embodiment of the present invention.

Referring to FIG. 1, the nano filament structure 10 may include a substrate 100, an electrode 162, a first layer 110, a second layer 130 having a nanometer gap disposed on the first layer 110, a catalyst layer 120 interposed between the first layer 110 and the second layer 130 and a nano filament 140. The first layer 110, the catalyst layer 120 and the second layer 130 may be sequentially stacked. One end of the nano filament 140 is in contact with the catalyst layer 120. The nano filament 140 may be disposed by penetrating the gap 132 of the second layer 130. The electrode 162 may be disposed between the substrate 100 and the first layer 110. The electrode 162 may be a means applying a current or a voltage to the nano filament 140.

The substrate 100 may be one of a semiconductor, a glass, a conductor and a dielectric. The substrate 100 may be diversely selected according to a function of the nano filament structure 10. The substrate 100 may be a means supporting the nano filament structure 10. The substrate 100 may be disposed to be perpendicular to the nano filament 140. According to a modified embodiment, the nano filament 140 may be disposed to be horizontal to the substrate 100.

The first layer 110 may be a conductive material. For example, the first layer 110 may include at least one of gold (Au), silver (Ag), silicon (Si), titanium nitride (TiN), tantalum nitride (TaN), tantalum (Ta), titanium (Ti), tungsten nitride (WN), indum tin oxide (ITO) and tungsten (W). A thickness of the first layer 110 may be 5 nm to 100 nm. The first layer 110 may be formed using a physical vapor deposition (CVD) process. The first layer 110, for example, is titanium nitride (TiN).

The catalyst layer 120 may include a catalyst that the nano filament 140 can grow. The catalyst layer 120 may be a metal compound including at least one of a pure metal, carbon, oxygen and nitrogen. The catalyst 120 may include at least one of a nano particle and a nano particle surrounded by a surfactant. The catalyst 120, for example, may be cobalt. A thickness of the catalyst layer 120 may be 1 nm to 50 nm. The catalyst layer 120 may be formed using a chemical vapor deposition (CVD) process.

The second layer 130 has a gap 132 of a nanometer. The second layer 130 may at least one of a columnar structure, a polycrystalline structure, an armophous structure and a porous structure. The gap 132 may penetrate the second layer 130. The second layer 130 may be conductor. The second layer 130 may include at least one of tungsten (W), titanium nitride (TiN), tantalum nitride (TaN), tantalum (Ta), and tungsten nitride (WN). A thickness of the second layer 130 may be 5 nm to 300 nm. The first layer 110 and the second layer 130 may be formed of the same material. The second layer 130 may be formed using a chemical vapor deposition (CVD) process or a physical vapor deposition (PVD) process. The second layer 130, for example, may be titanium nitride (TiN) of a columnar structure. The first layer 110, the catalyst layer 120 and the second layer 30 may be patterned. Also, side surfaces of the first layer 110, the catalyst layer 120 and the second layer 30 may be aligned with one another.

After depositing the second layer 130, an annealing process may proceed. The annealing process may be performed before forming the nano filament 140. The annealing process may change a density of the nano filament 140. A temperature of the annealing process may be equal to a temperature of a formation of the nano filament 140. The equipment performing the annealing process may be the same as the equipment forming the nano filament 140. According to a modified embodiment, the equipment performing the annealing process may be different from the equipment forming the nano filament 140.

The nano filament 140 may be at least one of carbon nano tube (CNT), silicon (Si), germanium (Ge), gallium arsenide (GaAs) and silicon carbide (SiC). The nano filament 140 is not limited to carbon nano tube (CNT), silicon (Si), germanium (Ge), gallium arsenide (GaAs) and silicon carbide (SiC), and may be applied to a phase change material. A length of the nano filament 140 may be several micro meters. The nano filament 140 may be formed using a chemical vapor deposition (CVD) process. Specifically, the nano filament 140 may be formed using a plasma enhanced CVD process and/or a thermal CVD process. A temperature of a formation of the nano filament 140 may be 600° C.~800° C. A density of the nano filament 140 may depend on a temperature of a formation of the nano filament 140. When the nano filament is formed without performing an annealing process, a density of the nano filament 140 may be lower than when an annealing process is performed.

The nano filament 140 may have a straight characteristic. The nano filament 140 may grow through the gap 132 of the second layer 130. A density and a diameter of the nano filament 140 may depend on a characteristic of the second layer 130. For example, a thickness of the second layer 130 may depend on a density of the nano filament 140. A density and a diameter of the gap 132 of the second layer 130 may depend on a density and a diameter of the nano filament 140, respectively.

The nano filament structure 10 may be applied to an electric field emission device, a tip of scanning probe microscope, an electro mechanical actuator, a nano tweezers, a memory device, a switch and an electrical material. The nano filament structure 10 according to an embodiment of the present invention is not limited to the use described above and may perform other functions.

Figure 2:
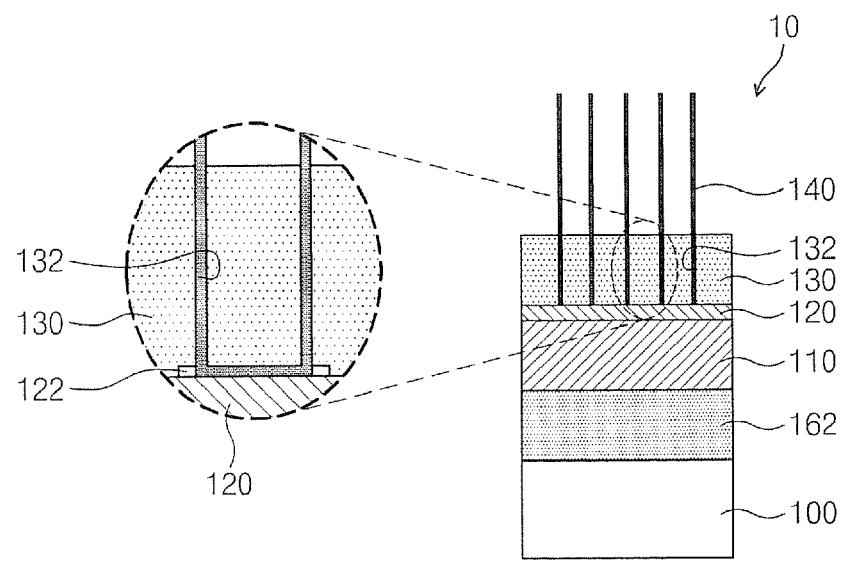
FIG. 2 is a cross sectional view of a nano filament structure according to another embodiment of the present invention.

FIG. 2 is a cross sectional view of a nano filament structure according to another embodiment of the present invention.

Referring to FIG. 2, the nano filament structure 10 may include a first layer 110 disposed on a substrate 100, a second layer 130 which has a gap 132 of nanometer size and is disposed on the first layer 110, a catalyst layer 120 interposed between the first layer 110 and the second layer 130, and a nano filament 140. One end of the nano filament 140 is in contact with the catalyst layer 120. The nano filament 140 may grow through the gap 132 of the second layer 130. A gap space 122 may be locally formed between the catalyst layer 120 and the second layer 130. One end of the nano filament 140 may be in contact with one end of an adjacent nano filament through the gap space 122. The nano filament 140 can be fixedly adhered to the second layer 130. Also, the nano filament 140 of the nano filament structure 10 may increase an area in contact with the catalyst layer 120 and/or the second layer 130. Thus, a contact resistance of the nano filament 140 and the second layer 130 may be reduced.

Figure 3:
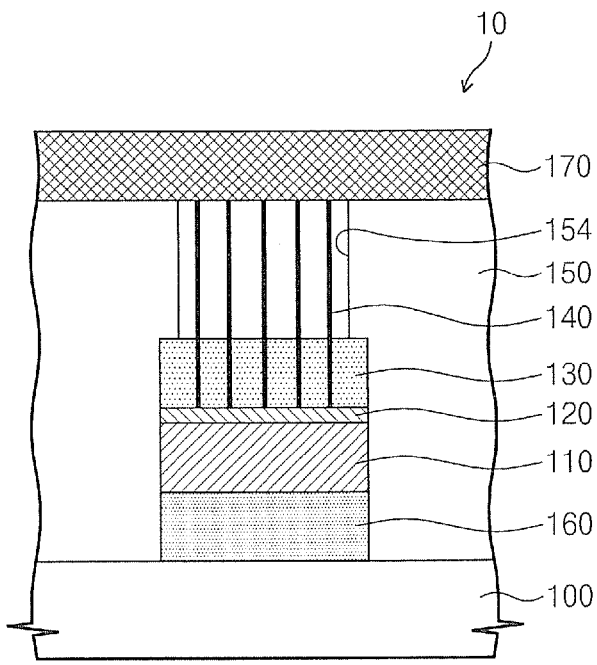
FIGS. 3 through 5 are cross sectional views of a nano filament structure according to other embodiments of the present invention.
Figure 4:
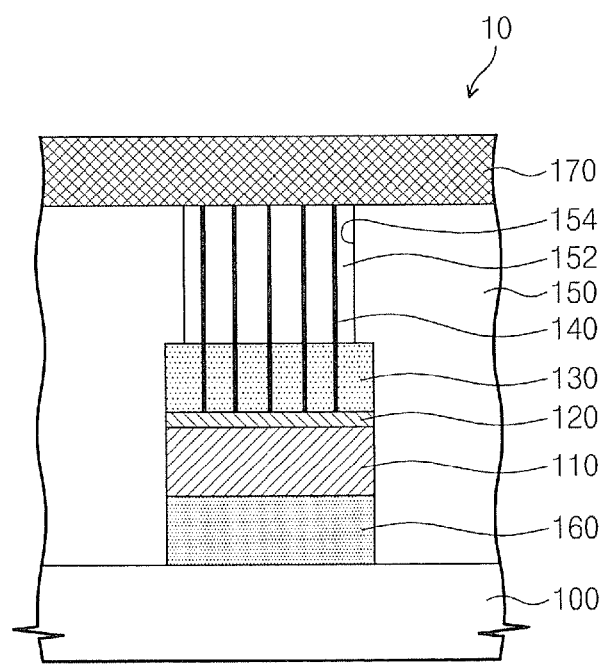
Figure 5:
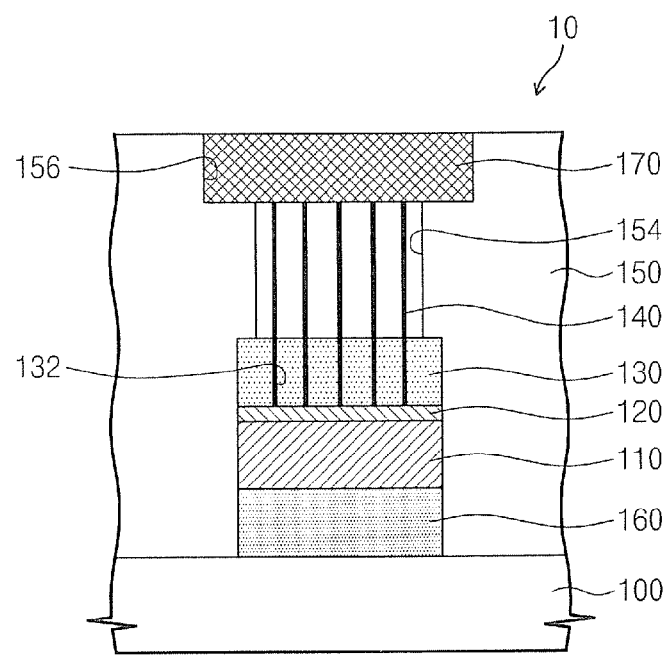

FIGS. 3 through 5 are cross sectional views of a nano filament structure according to other embodiments of the present invention.

Referring to FIG. 3, the nano filament structure 10 may include a lower interconnection 160, a first layer 110, a second layer 130 having a gap 132 of nanometer size disposed on the first layer 110, a catalyst layer 120 interposed between the first layer 110 and the second layer 130, and a nano filament 140. The lower interconnection 160, the first layer 110 and the second layer 130 may be sequentially stacked. One end of the nano filament 140 is in contact with the catalyst layer 120 and the nano filament 140 may be disposed by penetrating the gap 132 of the second layer 130. The lower interconnection 160, the first layer 110, the catalyst layer 120 and the second layer 130 may be patterned. Surfaces of the lower interconnection 160, the first layer 110, the catalyst layer 120 and the second layer 130 may be aligned with one another. An interlayer insulating layer 150 covering the lower interconnection 160, the first layer 110, the catalyst layer 120 and the second layer 130 may be disposed. A top surface of the interlayer insulating layer 150 may be planarized. The interlayer insulating layer 150 may be patterned to form a via hole 154 penetrating the interlayer insulating layer 150. The via hole 154 may expose the second layer 130. While the patterning process is performed, the second layer 130 is used as an etch stop layer to prevent the catalyst layer 120 from being damaged. The via hole 154 can expose a portion of the second layer 130 or an entire portion of the second layer 130. The nano filament 140 may be disposed inside of the via hole 154. The other end of the nano filament 140 may be even with a top surface of the interlayer insulating layer 150. The nano filament 140 may be densely disposed. A space between the nano filament 140 and an adjacent nano filament may be filled with air or a vacuum. An upper interconnection 170 may be disposed on the other end of the nano filament 140 and the interlayer insulating layer 150. The upper interconnection 170 may include at least one of metal, metal compound and a barrier material. The upper interconnection 170 may be a multi structure. The lower interconnection 160 and the upper interconnection 170 may be electrically connected to each other through first layer 110, the catalyst layer 120, the second layer 130 and the nano filament 140. The lower interconnection 160 may include at least one of metal, metal compound and a barrier material. The lower interconnection 160 may be a multi structure.

Referring to FIG. 4, the via hole 154 described referring to FIG. 3 may be filled with a via filling layer. The via filling layer 152 may fill a space between the nano filament 140 and an adjacent nano filament. The via filling layer 152 may be a silicon oxide layer.

Referring to FIG. 5, the nano filament structure 10 may include a lower interconnection 160, a first layer 110, a second layer 130 having a gap 132 of nanometer size disposed on the first layer 110, a catalyst layer 120 interposed between the first layer 110 and the second layer 130, a nano filament 140 and an upper interconnection 170. The first layer 110, the catalyst layer 120 and the second layer 130 may be sequentially stacked. One end of the nano filament 140 is in contact with the catalyst layer 120 and the nano filament 140 may be disposed by penetrating the gap 132 of the second layer 130. The lower interconnection 160, the first layer 110, the catalyst layer 120 and the second layer 130 may be patterned. Surfaces of the lower interconnection 160, the first layer 110, the catalyst layer 120 and the second layer 130 may be aligned with one another. An interlayer insulating layer 150 may cover the lower interconnection 160, the first layer 110, the catalyst layer 120 and the second layer 130. A top surface of the interlayer insulating layer 150 may be planarized. A via hole 154 may penetrate the interlayer insulating layer 150 to expose the second layer 130. The nano filament 140 may be disposed inside of the via hole 154. A trench 156 spatially connected to the via hole 154 may be disposed on the via hole 154. The upper interconnection 170 filling the trench 156 may be in contact with the other end of the nano filament 140. The nano filament structure 10 may be formed using a dual damascence process.

Figure 6A:
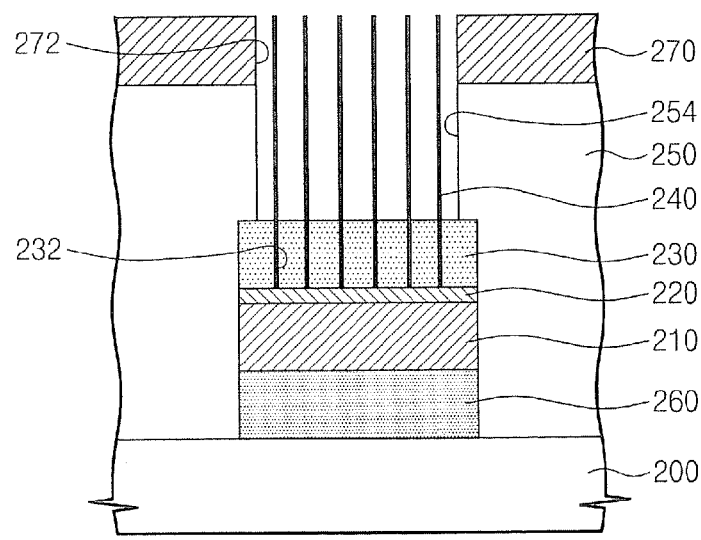
FIGS. 6a and 6b are cross sectional views of a nano filament structure according to other embodiments of the present invention
Figure 6B:
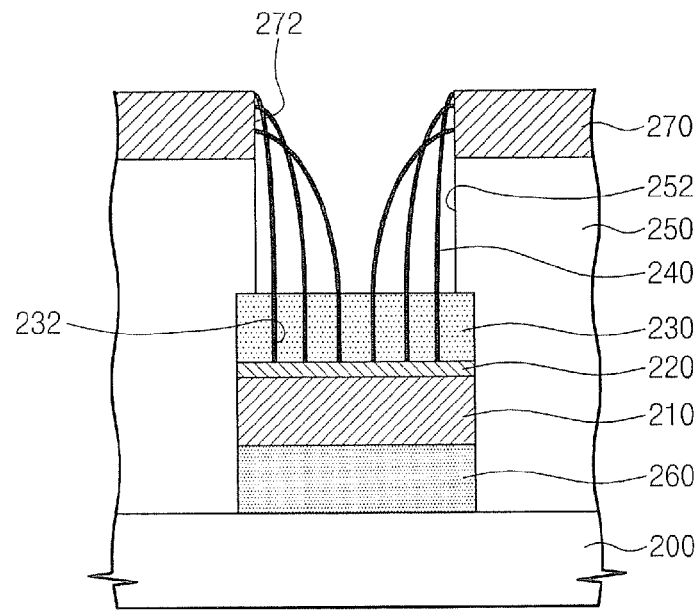

FIGS. 6a and 6b are cross sectional views of a nano filament structure according to other embodiments of the present invention Referring to FIGS. 6a and 6b, the nano filament structure may include a lower electrode 260 disposed on a substrate 200, a first layer 210, a second layer 230 having a gap 232 of nanometer size disposed on the first layer 210, a catalyst layer 220 interposed between the first layer 210 and the second layer 230, a nano filament 240. The first layer 210, the catalyst layer 220 and the second layer 230 may be sequentially stacked. One end of the nano filament 240 is in contact with the catalyst layer 220 and the nano filament 240 may be disposed by penetrating the gap 232 of the second layer 230. The lower electrode 260, the first layer 210, the catalyst layer 220 and the second layer 230 may be patterned. Surfaces of the lower electrode 260, the first layer 210, the catalyst layer 220 and the second layer 230 may be aligned with one another. An interlayer insulating layer 250 may cover the lower electrode 260, the first layer 210, the catalyst layer 220 and the second layer 230. A top surface of the interlayer insulating layer 250 may be planarized. An upper electrode 270 may be disposed on the interlayer insulating layer 250. The upper electrode 270 is patterned to form an upper electrode via hole 272 penetrating the upper electrode 270. The interlayer insulating layer 250 is patterned to form a via hole 252 which penetrates the interlayer insulating layer 250 and exposes the second layer 230. The upper electrode via hole 272 and the via hole 252 may be aligned with each other. While the patterning process is performed, the second layer 230 may be used as an etch stop layer to prevent the catalyst layer 220 from being damaged. The via hole 252 may expose a portion of the second layer 230 or an entire portion of the second layer 230. The nano filament 240 may be disposed inside of the via hole 252. The other end of the nano filament 240 may be higher than a top surface of the interlayer insulating layer 250. The upper electrode 270 may include at least one of metal, metal compound and a barrier material. The upper electrode 270 may be a multi structure. If a first voltage is applied to the upper electrode 270 and the lower electrode 260, the nano filament 240 is curved to the upper electrode 270 to electrically contact the upper electrode 270. When a first voltage is applied between the upper electrode 270 and the lower electrode 260, the nano filament 240 can be continuously in contact with the upper electrode 270 by a van der Waals force. If a second voltage is applied to the upper electrode 270 and the lower electrode 260, the nano filament 240 may be separated from the upper electrode 270. The first voltage may have a polarity different from the second voltage. A resistance of the nano filament structure may be changed depending on whether the nano filament 240 is in contact with the upper electrode 270 or not. Thus, the nano filament structure may be used as a switch and/or a memory device.

Figure 7:
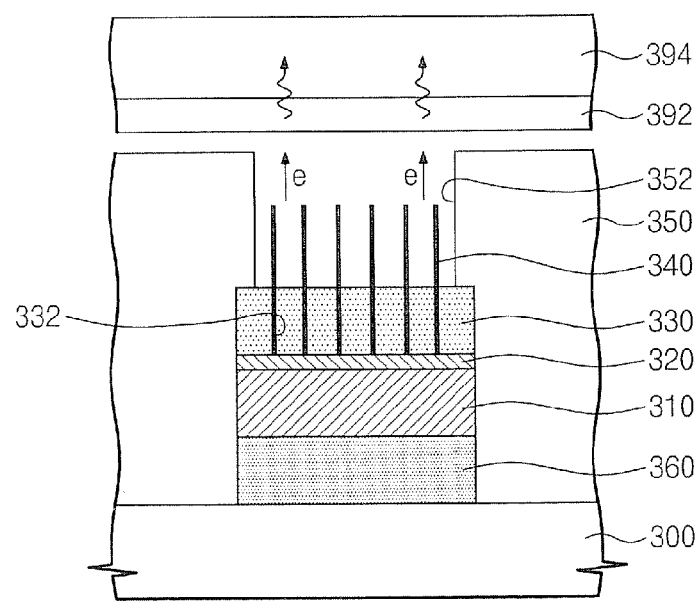
FIG. 7 is a cross sectional view of a nano filament structure according to another embodiment of the present invention.

FIG. 7 is a cross sectional view of a nano filament structure according to another embodiment of the present invention.

Referring to FIG. 7, the nano filament structure may include an electrode 360 disposed on a substrate 300, a first layer 310, a second layer 330 having a gap 332 of nanometer size disposed on the first layer 310, a catalyst layer 320 interposed between the first layer 310 and the second layer 330, a nano filament 340. The first layer 310, the catalyst layer 320 and the second layer 330 may be sequentially stacked. One end of the nano filament 340 is in contact with the catalyst layer 320 and the nano filament 340 may be disposed by penetrating the gap 332 of the second layer 330. The electrode 360, the first layer 310, the catalyst layer 320 and the second layer 330 may be patterned. Surfaces of the electrode 360, the first layer 310, the catalyst layer 320 and the second layer 330 may be aligned with one another. An interlayer insulating layer 350 may be disposed to cover the electrode 360, the first layer 310, the catalyst layer 320 and the second layer 330. A top surface of the interlayer insulating layer 350 may be planarized. The interlayer insulating layer 350 may be patterned to form a via hole 352 which penetrates the interlayer insulating layer 350 and exposes the second layer 330. While the patterning process is performed, the second layer 330 may be used as an etch stop layer. The via hole 352 may be in contact with a portion of the second layer 330 and/or an entire portion of the second layer 330. The nano filament 340 may be disposed inside of the via hole 352. The other end of the nano filament 340 may be lower than a top surface of the interlayer insulating layer 350. A fluorescent layer 392 may be disposed on the interlayer insulating layer 350 and the nano filament 340. The fluorescent layer 392 can emit light by a collision of an electron. An upper substrate 394 may be disposed on the fluorescent layer 392. The upper substrate 394 may be a transparent dielectric. The other end of the nano filament 340 can emit an electron when a voltage is applied. The nano filament structure may be used as a display device.

Figure 8A:
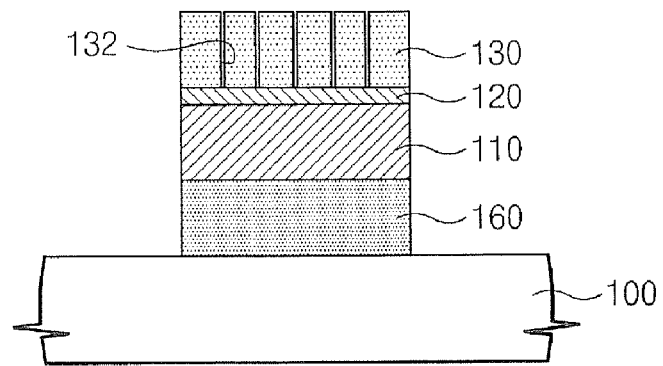
FIGS. 8a through 8c are cross sectional views illustrating a method of forming a nano filament structure according to an embodiment of the present invention.
Figure 8B:
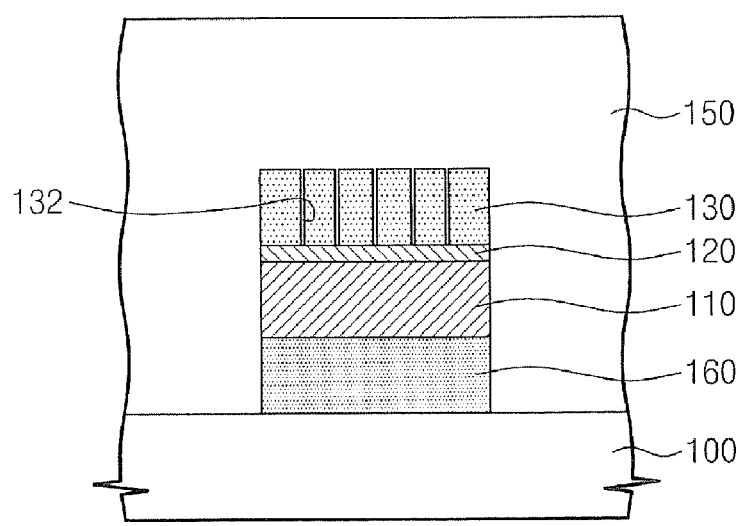
Figure 8C:
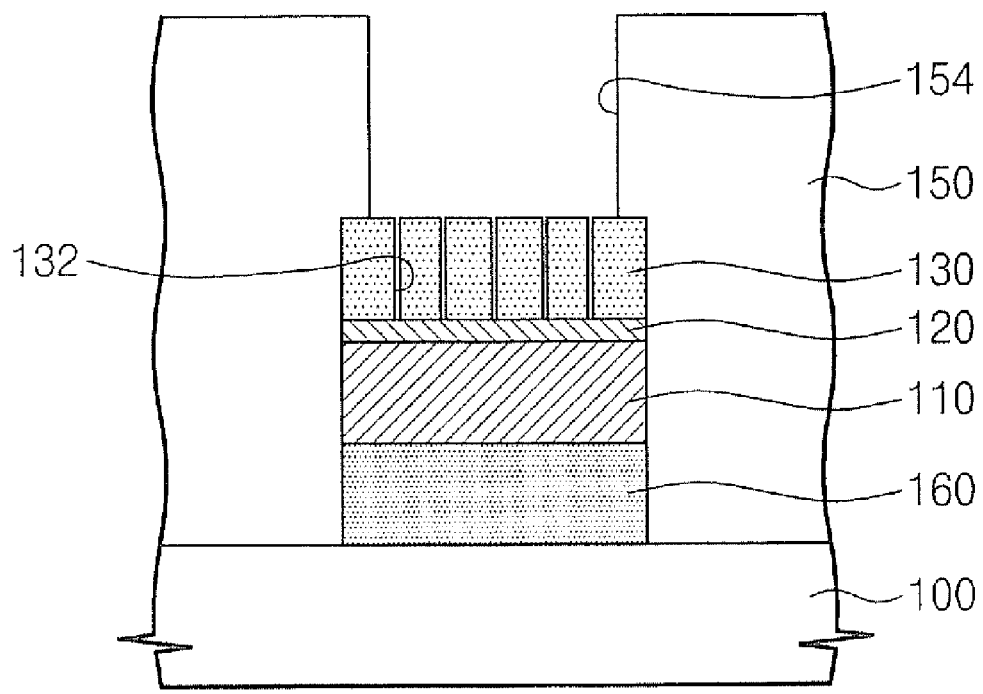

FIGS. 8a through 8c are cross sectional views illustrating a method of forming a nano filament structure according to an embodiment of the present invention.

Referring to FIG. 8a, a lower electrode 160, a first layer 110, a catalyst layer 120 and a second layer 130 may be sequentially stacked on a substrate 100. The lower electrode may be a conductor. The lower electrode may be electrically connected to a voltage applying circuit (not shown) or a current applying circuit (not shown). The second layer, the catalyst layer, the first layer and the lower electrode may be successively patterned.

The substrate 100 may be at least one of a semiconductor, a glass, a conductor and a dielectric. The substrate 100 may be diversely selected depending on a function of the nano filament structure 10. The substrate 100 may be a means supporting the nano filament 140. The substrate 100 may be disposed to be perpendicular to the nano filament 140. According to a modified embodiment, the nano filament may be disposed to be perpendicular to the substrate.

The first layer 110 may be a conductive material. The first layer 110 may include at least one of gold (Au), silver (Ag), silicon (Si), titanium nitride (TiN), tantalum nitride (TaN), tantalum (Ta), titanium (Ti), tungsten nitride (WN), induim tin oxide (ITO) and tungsten (W). A thickness of the first layer may be 5 nm to 100 nm. The first layer 110 may be formed using a physical vapor deposition (PVD) process.

The catalyst layer 120 may include a catalyst that the nano filament 140 can grow. The catalyst layer 120 may be metal compound including at least one of a pure metal, or carbon, oxygen and nitrogen. The catalyst layer 120 may include at least one of a nano particle and a nano particle surrounded by an interface activator. The catalyst layer 120 may be cobalt (Co). A thickness of the catalyst layer 120 may be 1 nm to 50 nm. The catalyst layer 120 may be formed by a chemical vapor deposition (CVD) process.

The second layer 130 has a gap 132 of nanometer size. The second layer 130 may include at least one of a columnar structure, a polycrystalline structure, an armophous structure and a porous structure. The gap 132 may be formed by the columnar structure, the polycrystalline structure, the armophous structure and the porous structure. The second layer 130 may be a conductor. The second layer 130 may include at least one of tungsten (W), titanium nitride (TiN), tantalum nitride (TaN), tantalum (Ta), tungsten nitride (WN). A thickness of the second layer 130 may be 5 nm to 300 nm. The first layer 110 and the second layer 130 may be formed of a same material. The second layer 130 may be formed by a CVD process or a PVD process.

Referring to FIG. 8b, an interlayer insulating layer is stacked. The interlayer insulating layer may be a silicon oxide layer-a silicon oxynitride layer-a silicon oxide layer. A top surface of the interlayer insulating layer may be patterned. The planarization may be performed by a chemical mechanical polishing (CMP) process or an etched back process.

Referring to FIG. 8c, the interlayer insulating layer may be patterned to form the via hole 154. The via hole 154 may expose the second layer 130. An annealing process may be performed to control a density and a diameter of the gap 132 of the second layer 130. According to a modified embodiment, the annealing process may be performed directly after the second layer 130 is formed. A temperature of the annealing process may be equal to a temperature of a formation of the nano filament 140. The temperature of the annealing process may be 600° C. to 800° C. When the nano filament 140 is formed without performing the annealing process, a density of the nano filament 140 may be lower than when performing the annealing process.

Referring to FIG. 3, the nano filament 140 may be formed. The nano filament 140 may be at least one of a carbon nano tube, silicon (Si), germanium (Ge), gallium arsenide (GaAs) and silicon carbide (SiC). A length of the nano filament 140 may be several micrometers. A diameter of the nano filament 140 may be several nanometers. The nano filament 140 may be formed using a CVD process. The nano filament 140 may be formed using a plasma enhanced CVD and/or a thermal CVD. The nano filament 140 may have a straight characteristic. A density and a diameter of the nano filament 140 may depend on a characteristic of the second layer 130. For example, a density and a diameter of the gap 132 of the second layer 130 may be in proportion to a density and a diameter of the nano filament 140, respectively. An upper electrode 170 may be formed on the nano filament 140 and the interlayer insulating layer 150. The upper electrode 170 may be patterned.

What is claimed is:

1. A nano-filament structure, comprising:
a first electrically conductive layer on a substrate;
a second layer on said first electrically conductive layer, said second layer having at least a first nanopore extending therethrough;
a catalyst layer extending between said first electrically conductive layer and said second layer;
a first electrically conductive nano-filament extending through the first nanopore and electrically coupled to said catalyst layer; and
an electrode extending adjacent a distal end of said first electrically conductive nano-filament, said distal end of said first electrically conductive nano-filament configured to contact the electrode upon application of a first polarity voltage therebetween that creates an electrical attraction between the distal end and the electrode, but release from the electrode upon application of a second polarity voltage therebetween that reduces the electrical attraction.

2. The nano-filament structure of claim 1, wherein said catalyst layer comprises at least one of a nano-particle and a nano-particle surrounded by an interface activator.

3. The nano-filament structure of claim 1, wherein said second layer and said catalyst layer comprise electrically conductive materials.

4. The nano-filament structure of claim 1, wherein said first electrically conductive layer comprises a material selected from a group consisting of gold, silver, silicon, indium tin oxide and tungsten; and wherein said second layer comprises a material selected from a group consisting of tungsten, titanium nitride, tantalum nitride, tantalum and tungsten nitride.

5. The nano-filament structure of claim 1, wherein said catalyst layer comprises a material selected from a group consisting of a metal, carbon, oxygen and nitrogen.

6. The nano-filament structure of claim 1, wherein said first electrically conductive nano-filament is a carbon nanotube.

* * * * *